(12) United States Patent
Han

(10) Patent No.: US 6,849,886 B1
(45) Date of Patent: Feb. 1, 2005

(54) CMOS IMAGE SENSOR AND METHOD FOR MANUFACTURING THE SAME

(75) Inventor: Chang Hun Han, Icheon-Si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/746,615

(22) Filed: Dec. 23, 2003

(30) Foreign Application Priority Data

Sep. 22, 2003 (KR) .................................. 10-2003-0065688

(51) Int. Cl.[7] ............................................ H01L 31/062
(52) U.S. Cl. ........................ 257/292; 257/396; 438/73; 438/78; 438/424
(58) Field of Search ................................. 257/291, 292, 257/396, 446, 461; 438/73, 78, 424

(56) References Cited

U.S. PATENT DOCUMENTS 4,722,910 A * 2/1988 Yasaitis ...................... 438/297
5,859,450 A * 1/1999 Clark et al. ................. 257/233
6,462,365 B1 10/2002 He et al.

* cited by examiner

Primary Examiner—Sara Crane
(74) Attorney, Agent, or Firm—Andrew D. Fortney

(57) ABSTRACT

A CMOS image sensor and a method for manufacturing the same, capable of preventing an interface between an active region and a field region in the CMOS image sensor from being damaged by ion implantation. The method comprises the steps of depositing a sacrificial oxide layer and a hard mask layer on a semiconductor substrate; etching the sacrificial oxide layer and the hard mask layer to form a mask pattern; etching the substrate to a predetermined depth to form a trench; depositing an isolating material in the trench and planarizing it until substantially coplanar with the hard mask layer; removing the hard mask layer to leave a protrusion in the isolating layer; depositing an insulating layer on the substrate and isolating layer; and etching the insulating layer and the sacrificial oxide layer sufficiently to form a spacer mask and expose the surface of the substrate.

20 Claims, 7 Drawing Sheets

CMOS IMAGE SENSOR AND METHOD FOR MANUFACTURING THE SAME

BACKGROUND OF THE INVENTION

1. Field of the Invention

The present invention relates to a CMOS image sensor and method for manufacturing the same, and more particularly to a CMOS image sensor and method for manufacturing the same, in which active and field regions of the CMOS image sensor are not damaged by ion implantation.

2. Description of the Related Art

In general, an image sensor is a semiconductor device for converting an optical image into an electrical signal, and is generally classified into a CCD (Charge Coupled Device) and a CMOS (Complementary MOS) image sensor.

The CCD is a device in which charge carriers are stored and transferred under the situation that each MOS capacitor is closely disposed to each other, while the CMOS image sensor is a device employing a switching mode of forming MOS transistors as many as the number of pixels using CMOS technology, which makes use of controlling and signal processing circuits as a peripheral circuit, to detect outputs using the MOS transistors.

The CCD has various disadvantages, such as complicated drive mode, much power consumption, impossibility of realization of a signal processing circuit in a chip for the CCD due to many mask processes, and so on. Currently, in order to overcome these disadvantages, many studies are made of development of the CMOS image sensor using sub-micron CMOS manufacturing technology.

The CMOS image sensor obtains an image by forming a photodiode and a MOS transistor within a unit pixel to detect signals in a switching mode. As mentioned above, because the CMOS image sensor makes use of such CMOS manufacturing technology, the CMOS image sensor has little power consumption as well as a simple manufacturing process requiring about 20 masks, compared with the CCD manufacturing process requiring 30 to 40 masks. As a result, the CMOS image sensor can integrate a signal processing circuit into a single chip, so that it is possible to make a product compact, and thereby allowing for various applications.

Hereinafter, a description will be made regarding a construction of a conventional CMOS image sensor. FIGS. 1 and 2 are a circuit diagram and a layout diagram showing a structure of a unit pixel of the conventional CMOS image sensor. For the sake of reference, the number of transistors constituting the CMOS image sensor is three or more. However, for the sake of convenience of description, the CMOS image sensor with three transistors will be mainly described.

As shown in FIGS. 1 and 2, a unit pixel 100 of the CMOS image sensor comprises a photodiode 110 as a means for sensing light and three NMOS (N-channel Metal Oxide Semiconductor) transistors. Among the three transistors, one is a reset transistor (Rx) 120, which functions not only to transfer optical charges generated from the photodiode 110 but also to discharge charges so as to detect signals, another is a drive transistor (Dx) 130, which functions as a source follower, and the other is a select transistor (Sx) 140, which performs switching and addressing functions.

Meanwhile, in the CMOS image sensor of the unit pixel, the photodiode 110 is designed to function as a source of the reset transistor (Rx) 120 in order to facilitate movement of the charges. To this end, in the course of manufacturing the image sensor of the unit pixel, a process of implanting low- or high-concentration dopant ions into a location including a part of the photodiode 110 is used as shown in FIG. 2. The manufacturing process will be described with reference to a cross-section taken along line A–A' of FIG. 2. For the sake of reference, a solid line of FIG. 2 indicates an active region 160.

First, as shown in FIG. 3a, a gate insulating layer 122 and a gate electrode 123 are sequentially formed on a p-type semiconductor substrate 101, on which an isolating layer 121 is completely formed using a shallow trench isolation (STI) and the like. Here, even though not shown, a p-type epitaxial layer may be previously formed within the p-type substrate. Subsequently, a photosensitive layer is applied on the front surface of the substrate, and then a pattern for the photosensitive layer, which defines a region of the photodiode, is formed using a photolithography process. Here, the photosensitive layer pattern does not expose the gate electrode.

In this state, low-concentration dopant ions, for example n-type dopant ions, are implanted into the substrate, so that there is formed a low-concentration dopant region n– having a predetermined depth in the substrate.

Next, as shown in FIG. 3b, another photosensitive layer pattern which does not expose the low-concentration dopant region is formed, and then another low-concentration dopant region for an LDD structure is formed in a drain region of the electrode using the another photosensitive layer pattern as an ion implantation mask.

Subsequently, as shown in FIG. 3c, a spacer is formed on a side wall of the gate electrode, and then a p-type dopant region $p^0$ is formed on the n-type dopant region n–. Thereby, a process of forming the photodiode is completed. When the photodiode is finished, high-concentration dopant ions are selectively implanted to form a high-concentration dopant region n+ in the drain region of the gate electrode. As a result, the process associated with the cross-section taken along line A–A' of FIG. 2 is terminated.

According to the conventional method for manufacturing the CMOS image sensor, during implantation of low-concentration dopant ions in the photodiode region, the implantation is performed throughout the active region as well as the isolating layer. In this case, because of an interface between the isolating layer and the active region, defects may be generated in the substrate by ions implanted into the interface.

These defects caused by ion implantation generate carriers of the charges or holes and provide locations at which the charges and holes may be rejoined, thus generating or increasing a leakage current of the photodiode. In other words, a dark current (i.e., a phenomenon that electrons move to a floating diffusion region in the photodiode while no light is present) is generated. The dark current is mainly incurred form various defects distributed around the silicon surface, at the interface between the isolating layer and the p-type dopant region $p^0$, at the interface between the isolating layer and the low-concentration dopant region n–, at the interface between the p-type dopant region $p^0$ and the low-concentration dopant region n–, at the p region or at the low-concentration dopant region n– or from a dangling bond. The dark current adversely affects low illumination characteristics of the CMOS image sensor.

Further, when an ion implantation mask is formed on the isolating layer from the photosensitive layer pattern in order to prevent dopant ions from being doped into the isolating layer, the I-line wavelength used as an exposure source for patterning the photosensitive layer may cause minute variations in the pattern profile, so that it is difficult to exactly align the isolating layer with the photosensitive layer pattern. For this reason, when an image sensor having repeated unit pixels is manufactured, the image sensor may have a reproducibility problem in the unit pixels not having exactly the same characteristics.

It is proposed from U.S. Pat. No. 6,462,365 that an isolating layer and a transfer gate are formed at a location corresponding to a photodiode region in order to restrict a dark current generated by a damaged photodiode. In addition, various resolutions for minimizing the dark current have been proposed. However, effective solutions related to defects generated by ion implantation at the interface between the isolating layer and the active region are generally not widely known or practiced.

SUMMARY OF THE INVENTION

Accordingly, the present invention has been made to solve the above-mentioned problems, and an object of the present invention is to provide a complementary metal oxide semiconductor (CMOS) image sensor and a method for manufacturing the same, in which an interface between an active region and a field region in the CMOS image sensor is inhibited or prevented from being damaged by ion implantation.

In order to accomplish this object, according to one aspect of the present invention, there is provided a complementary metal oxide semiconductor (CMOS) image sensor comprising: an isolating layer defining a photodiode region within an active region, having a protrusion from a substrate surface of a predetermined thickness; a sacrificial oxide layer formed on the surface of said substrate located on right and left sides of said isolating layer; and an implant spacer mask on said sacrificial layer and adjacent to sidewalls of said isolation layer.

Preferably, the spacer mask comprises a nitride layer, and may have a thickness of from 500 to 1500 Å.

In order to accomplish this object, according to another aspect of the present invention, there is provided a method for manufacturing a complementary metal oxide semiconductor (CMOS) image sensor, comprising the steps of: depositing a sacrificial oxide layer and a hard mask layer on a semiconductor substrate; patterning said sacrificial oxide layer and said hard mask layer to define isolation regions in said substrate; etching said substrate to a predetermined depth to form a trench; depositing an isolating material in said trench and planarizing said isolating material until substantially coplanar with the hard mask layer; removing the hard mask layer to leave a protrusion in the isolating layer; depositing a second insulating layer on said substrate and over said isolating layer; and forming a spacer mask adjacent to the sidewalls of the isolating layer by anisotropically etching said insulating layer and said sacrificial oxide layer.

Preferably, during implantation of low-concentration dopant ions into a photodiode region, the spacer mask prevents a boundary of the isolating layer from adjoining a boundary of the photodiode implant region.

Preferably, after implantation of the low-concentration dopant ions into the photodiode region, high-concentration dopant ions are further implanted into the photodiode region to reduce a dark current generated on the surface of the substrate.

It is preferable that the insulating layer comprises a nitride layer and/or has a thickness of from 500 to 1500 Å.

According to a characteristic construction of the present invention, by forming a protrusion in an isolating layer higher than the substrate, and by forming a spacer mask on the side walls of the isolating layer functioning as a partition wall, dopant ions during formation of the photodiode is not implanted into an interface between the isolating layer and an active region, so that defects caused by ion implantation of the interface can be prevented in advance.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 4:
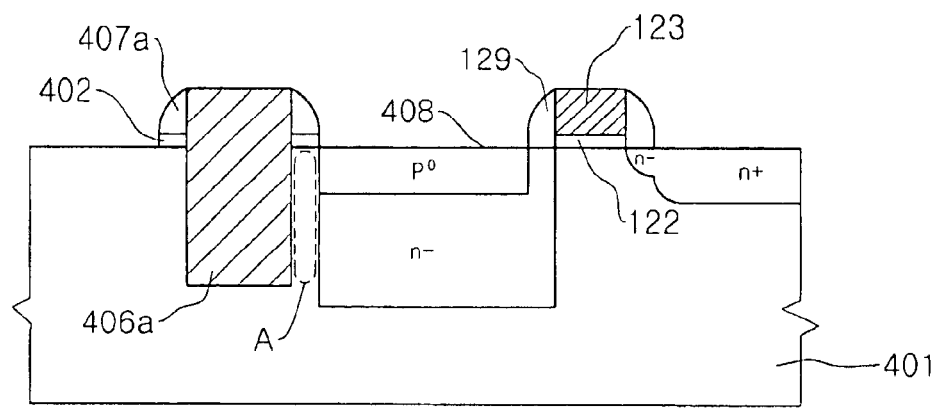
FIG. 4 is a sectional view showing a structure of a CMOS image sensor according to the present invention.

Hereinafter, a CMOS image sensor according to the present invention and a method for manufacturing the same will be described with reference to the accompanying drawings. FIG. 4 is a sectional view showing a structure of a CMOS image sensor according to the present invention. FIGS. 5a to 5g are process sectional views for explaining a method for manufacturing a CMOS image sensor according to the present invention. Here, FIGS. 5a to 5d each correspond to a sectional view taken along line A–A' of FIG. 2.

First, as shown in FIG. 4, for the CMOS image sensor according to the present invention, a field region of the semiconductor substrate 401 is provided with an isolating layer 406a in order to isolate an active region of a semiconductor substrate. A gate insulating layer 122 and a gate electrode 123 are sequentially formed on a preset part of the active region of the substrate. Each spacer 129 is formed on side walls of the gate insulating layer 122 and the gate electrode 123. A photodiode region 408 is defined by the gate electrode 123 and the isolating layer 406a. The photodiode region 408 includes an n-type dopant region and a p-type dopant region, both of which have a low concentration. Further, a drain region n+ having an LDD structure is formed in the substrate, which is located on an opposing side of the gate electrode 123.

Meanwhile, a predetermined thickness of the isolating layer 406a protrudes from the substrate 401. A sacrificial oxide layer 402 is formed on the substrate, which is located on right and left sides of the isolating layer 406a (although the sacrifical oxide layer 402 may or may not be present in a final structure). A spacer mask 407a is formed on the sacrificial oxide layer 402 or on substrate 401, if sacrificial oxide layer 402 is not present. Owing to the spacer mask 407a, during a process of implanting low-concentration dopant ions into a photodiode region, it is possible to prevent the dopant ions from being implanted into the interface A between the isolating layer 406a and the active photodiode region.

Figure 5A:
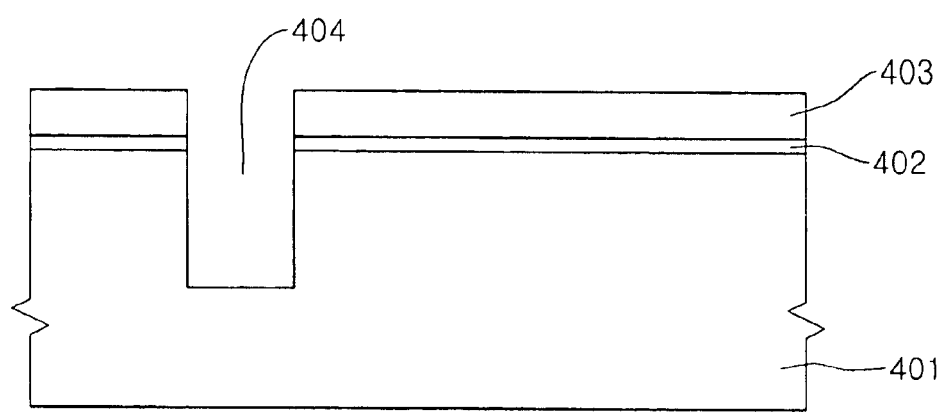
FIGS. 5a to 5g are process sectional views for explaining a method for manufacturing a CMOS image sensor according to the present invention.

A detailed description will be made regarding a method for manufacturing the CMOS image sensor having this structure. First, as shown in FIG. 5a, a sacrificial oxide layer 402 may be grown or deposited (preferably grown in accordance with conventional wet or dry thermal oxidation techniques) on the semiconductor substrate 401 (such as a single crystal silicon substrate). Sacrificial oxide layer 402 preferably has a thickness of from 40 to 150 Å. Next, a sacrificial nitride layer 403 (preferably comprising or consisting essentially of silicon nitride), as a hard mask layer, is deposited on the sacrificial oxide layer 402 at a thickness of from 600 to 1500 Å by a low-pressure chemical vapor deposition process. The sacrificial oxide layer 402 is for reducing or releasing stresses on the semiconductor substrate 401 from the sacrificial nitride layer 403. The sacrificial nitride layer 403 may be used as an etching mask layer while forming a trench 404 and as a polish stop layer in a subsequent chemical mechanical polishing process.

Then, to position an opening of a photosensitive layer (not shown, but generally comprising a conventional positive or negative photoresist) over the field region of the substrate 401, a pattern of the photosensitive layer is formed to define certain boundaries of active regions of the substrate 401. The sacrificial nitride layer 403 and the sacrificial oxide layer 402, both of which are sequentially exposed in the opening resulting from developing the photoresist, are completely etched by an anisotropic dry etching process, for example a reactive ion etching (RIE) process, using the pattern of the photosensitive layer as an etching mask, so that the field region of the substrate 401 is exposed. Then, the remaining photosensitive layer is removed, and the resulting structure may be conventionally cleaned.

Subsequently, the exposed field region of the substrate 401 is etched to a depth of about 3000 Å by a RIE process using the remaining sacrificial nitride layer 403 as an etching mask. Thus, a trench 404 is formed within the field region of the substrate 401.

Figure 5B:
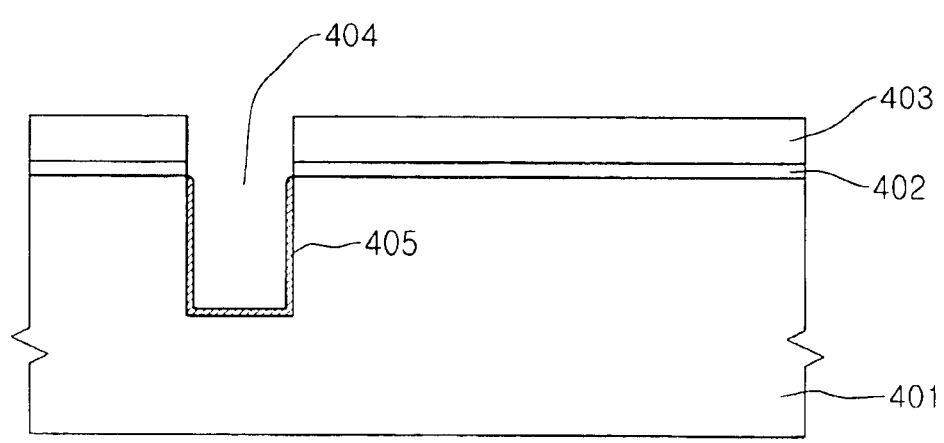

Referring to FIG. 5b, after the trench 404 is formed, an insulating layer, specifically a thermal oxidation layer 405 is grown on the surface of the substrate 401 within the trench 404 to a thickness of from 200 to 400 Å by a thermal oxidation process. Here, the thermal oxidation layer 405 prepares and/or repairs the surface of the substrate 401 within the trench 404, which may damaged by a plasma used in the trench etch step. Although not wishing to be constrined by any particular theory, thermal oxidation layer 405 is believed to remove dangling bonds which may be present on the surface of the substrate 401 within the trench 404. Further, the thermal oxidation layer 405 is believed to function to enhance bonding characteristics with the isolating layer 406, which will be formed in subsequent steps. However, thermal oxidation layer 405 is not required, because the isolation structure formed in subsequent process steps may be formed without the thermal oxidation layer.

Figure 5C:
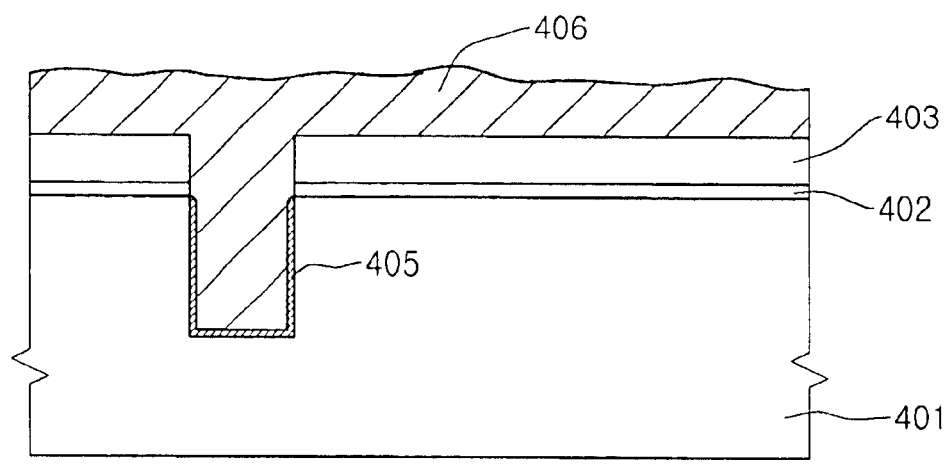

Referring to FIG. 5c, an insulating layer 406 for the isolating layer is deposited on the surface of the substrate 401 at a thickness sufficient to fully fill the trench 404. At this point, insulating layer 406 is also present on the sacrificial nitride layer 403 outside the trench 404. Here, it is preferable that the insulating layer 406 within the trench 404 has no empty space, that is, no void. Further, although the insulating layer 406 for the isolation structure may vary slightly according to semiconductor device design rules, it may be deposited by an O₃-TEOS (tetraethyl orthosilicate) chemical vapor deposition (APCVD) process at or around atmospheric pressure, or by high-density plasma chemical vapor deposition (HDP CVD).

Meanwhile, for the sake of convenience of description, it is assumed that the insulating layer 406 for the isolating layer consists of a single layer. However, it is possible for the insulating layer 406 to comprise a multilayer structure having two or more layers, for example an oxide layer and a nitride layer.

Figure 5D:
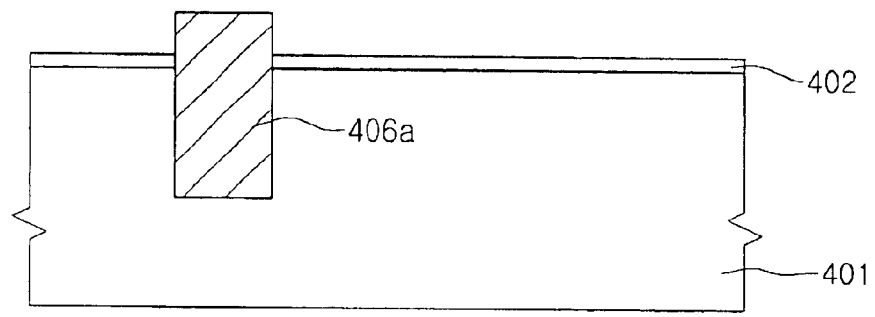

As shown in FIG. 5d, the insulating layer 406 for the isolation structure is polished by a chemical mechanical polishing process, thus being planarized with the sacrificial nitride layer 403. Then, the sacrificial nitride layer 403 is wet etched (e.g., using a phosphoric acid solution), to expose the sacrificial oxide layer 402. As a result, the isolating layer 406a is completed. Here, the isolation structure, unlike the conventional one, has a shape partially protruding from the substrate by a combined height of the sacrificial oxide and nitride layers 403 and 402.

Figure 5E:
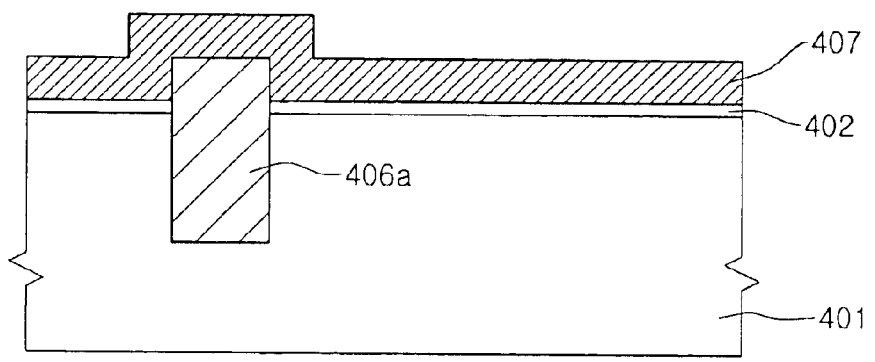
Figure 5F:
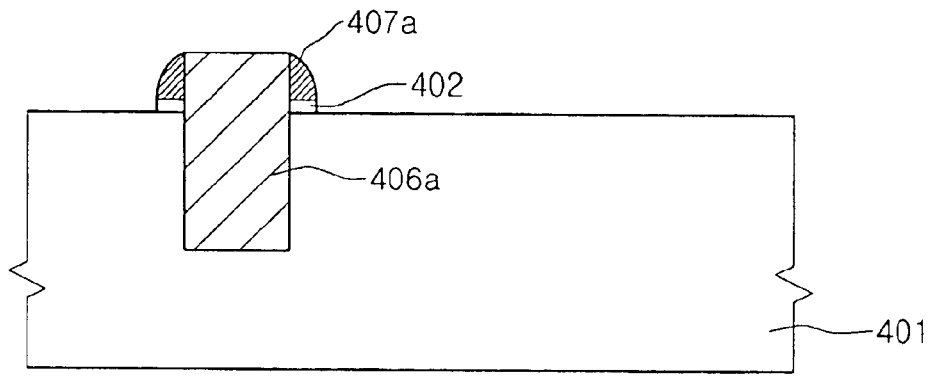

Then, as shown in FIG. 5e, an insulating layer (for example, a silicon nitride layer) 407 is conventionally deposited on the surface of the substrate and the isolating layer 406a at a thickness of from 500 to 1500 Å (e.g., using a low-pressure CVD process). Alternatively, if oxide spacers can be used as implant masks in this step, the sacrificial oxide layer can be conventionally removed prior to depositing insulating layer 407

The insulating layer 407 and (if present) the sacrificial oxide layer 402 are anisotropically etched (e.g., by conventional dry etching, or RIE) until the upper surfaces of the substrate 401 and the isolating layer 406a within the active region are exposed. Thus, the insulating layer (i.e., a spacer mask layer 407a) is left only on the side wall of the isolation structure 406a.

Figure 5G:
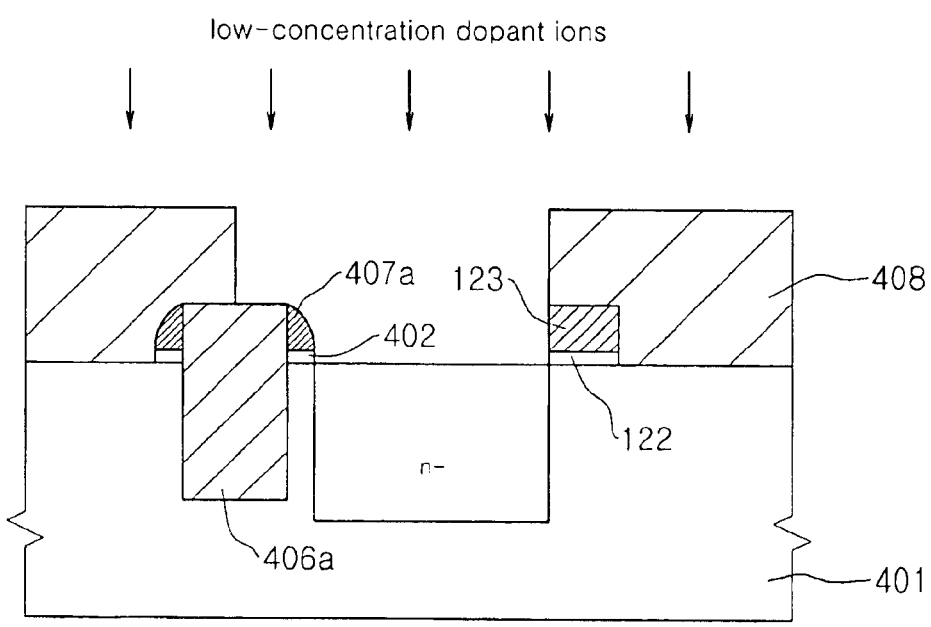

Thereafter, typical processes for manufacturing the image sensor are preformed. In other words, as shown in FIG. 5g, patterns of the gate insulating layer 122 and the gate electrode 123 are formed at a predetermined locations over the active region of substrate 401. Then, a photosensitive layer is deposited on the surface of the substrate. Subsequently, a pattern 408 of the photosensitive layer defining a photodiode region is formed by photolithography.

In this state, low-concentration dopant ions, for example n-type dopant ions, are implanted into the exposed surface of the substrate to form a low-concentration dopant region n− having a predetermined depth. Then, even though not shown in the drawings, p-type dopant ions may be implanted into the upper (exposed) surface of the low-concentration dopant region. As a result, the photodiode can be completed.

Meanwhile, the low-concentration n(−)-dopant region of the photodiode is formed a predetermined distance (i.e., a width of the spacer 407a) apart from the isolating layer 406a. Thus, the spacer mask 407a located on the sidewalls of the isolation structure 406a inhibits or prevents ions from being implanted into the interface between the isolation structure and the active (implant) region of the photodiode. As such, conventional defects generated by ion implantation at the interface between the isolation structure and the active region can be reduced or obviated in advance.

Figure 1:
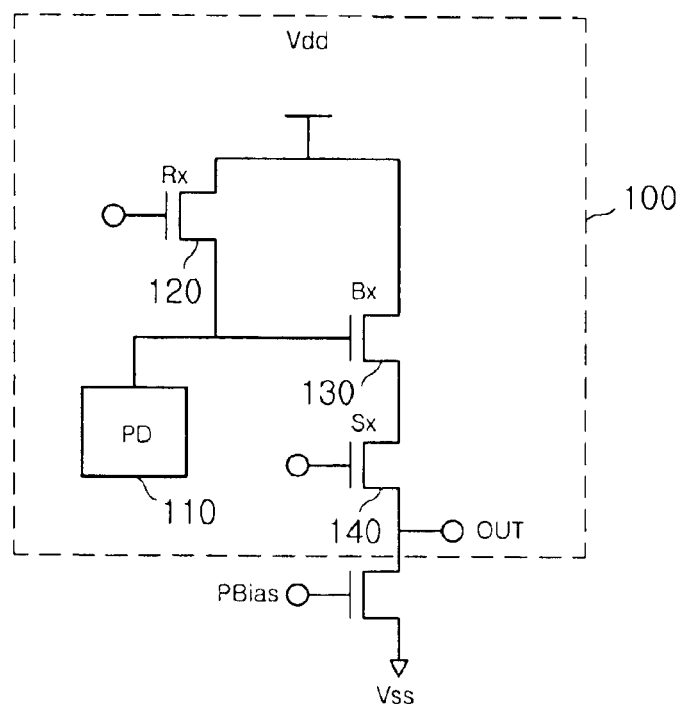
FIG. 1 is a schematic circuit diagram showing a structure of a unit pixel of a conventional CMOS image sensor.
Figure 2:
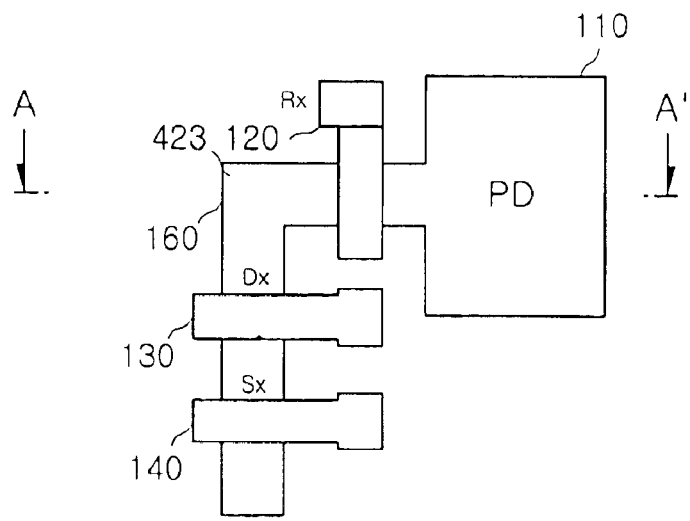
FIG. 2 is a layout diagram showing a unit pixel of a conventional CMOS image sensor.
Figure 3A:
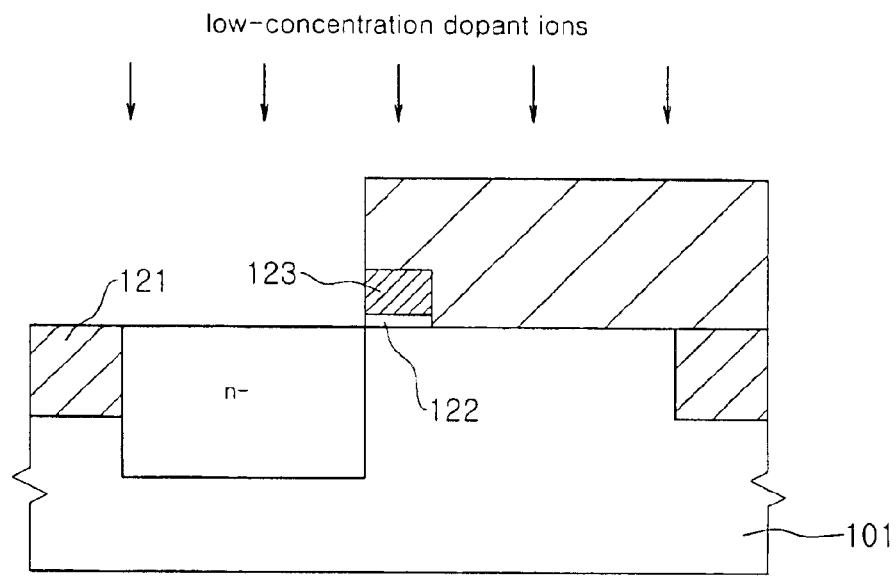
FIGS. 3a to 3c are sectional views taken along line A–A' of FIG. 2 after certain steps of a conventional process for making the CMOS image sensor of FIGS. 1 and 2.
Figure 3B:
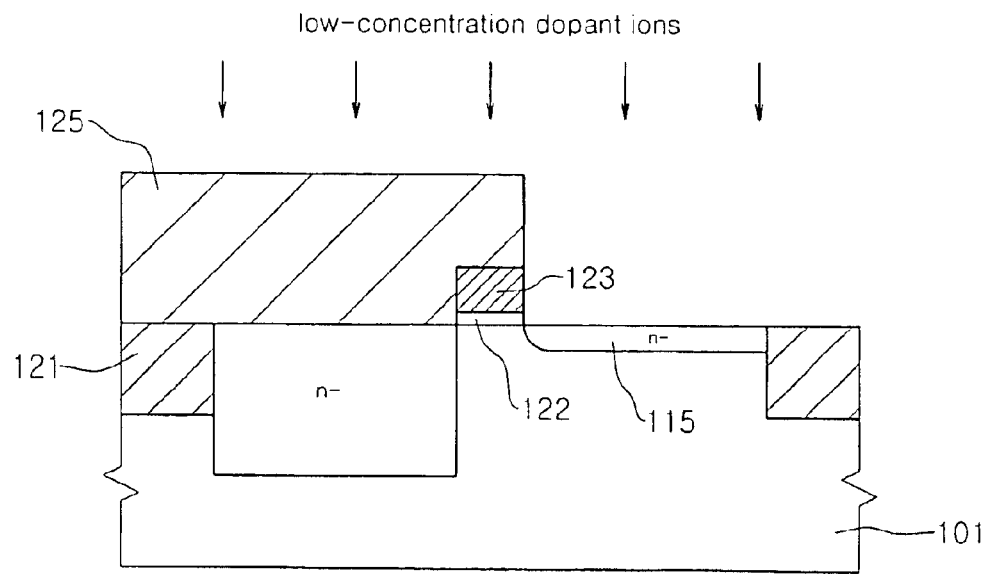
Figure 3C:
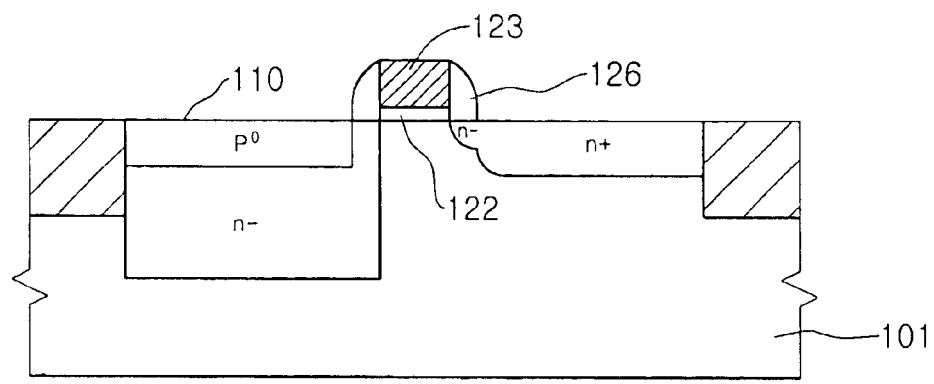

As mentioned above, the method for manufacturing the CMOS image sensor according to the present invention has been described on the basis of the cross-section taken along ling A–A' of FIG. 2, but it is equally applied to isolating layers of the whole field regions adjoining the photodiode.

Further, the embodiment of the present invention has been described regarding the CMOS image sensor having three transistors. However, it is naturally that the embodiment of the present invention is equally applied to all the CMOS image sensors having three or more transistors.

The CMOS image sensor according to the present invention and the method for manufacturing the same have various effects as follows. By forming a protruding isolating layer adjoining a photodiode region, and by forming a spacer mask on the sidewalls of the isolating layer functioning as a partition wall, dopant ions during are generally not implanted into an interface between the isolating layer and a photodiode active region during formation of the photodiode, so that defects caused by ion implantation at the interface can be prevented in advance. Thus, a leakage current of the photodiode can be reduced or prevented, and ultimately dark current can be minimized. Further, a spacer masking layer is formed on the sidewalls of the isolating layer functioning as a partition wall, so that it is possible to make a unit pixel having a predetermined doping profile, thereby ensuring more stable operation characteristics in CMOS image sensors on a semiconductor die.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A complementary metal oxide semiconductor (CMOS) image sensor comprising:
   (a) an isolating layer defining a photodiode region boundary and having a protrusion from a surface of a substrate of a predetermined thickness;
   (b) a sacrificial insulator layer on the surface of said substrate located on opposed sides of said isolating layer; and
   (c) first and second spacers on said sacrificial insulator layer and adjacent to sidewalls of said isolating layer.

2. The CMOS image sensor as claimed in claim 1, wherein said first and second spacers comprise a nitride.

3. The CMOS image sensor as claimed in claim 1, wherein said first and second spacers have a thickness of from 500 to 1500 Å.

4. The CMOS image sensor as claimed in claim 1, wherein said sacrificial insulator layer comprises an oxide.

5. A structure for reducing dark current in a complementary metal oxide semiconductor (CMOS) image sensor, comprising:
   (a) an isolation structure defining a photodiode region boundary and having a protrusion from a surface of a substrate of a predetermined thickness;
   (b) first and second spacers adjacent to sidewalls of said isolation structure; and
   (c) a photodiode region in said substrate and having a boundary closest to said isolation structure spaced apart from said isolation structure.

6. The structure as claimed in claim 4, wherein said first and second spacers comprise a nitride.

7. The structure as claimed in claim 4, wherein said first and second spacers have a thickness of from 500 to 1500 Å.

8. The structure as claimed in claim 4, wherein said protrusion extends from said substrate surface by an amount of from 640 to 1650 Å.

9. A method for manufacturing a complementary metal oxide semiconductor (CMOS) image sensor, comprising the steps of:
   (a) depositing a sacrificial oxide layer and a hard mask layer on a semiconductor substrate;
   (b) patterning said sacrificial oxide layer and said hard mask layer;
   (c) etching said substrate to a predetermined depth to form a trench;
   (d) depositing an isolating material in said trench and planarizing said isolating material until substantially coplanar with the hard mask layer;
   (e) removing the hard mask layer to leave a protrusion in the isolating layer;
   (f) depositing an insulating layer on said substrate and said isolating layer; and
   (g) anisotropically etching said insulating layer to form first and second spacers on the sidewalls of the isolating layer and said sacrificial oxide layer.

10. The method as claimed in claim 9, further comprising the step of implanting low concentration dopant ions into a photodiode region of said substrate, wherein said photodiode region is separated from said isolation layer.

11. The method as claimed in claim 10, further comprising, after implanting said low concentration dopant ions into said photodiode region, implanting high concentration dopant ions into the exposed surface of said substrate.

12. The method as claimed in claim 9, wherein said insulating layer comprises a nitride layer.

13. The method as claimed in claim 5, wherein said insulating layer has a thickness of from 500 to 1500 Å.

14. A method for reducing dark current in a complementary metal oxide semiconductor (CMOS) image sensor, comprising the steps of:
   (a) depositing an isolating material in a trench in a mask layer and a semiconductor substrate under said mask layer;
   (b) planarizing said isolating material;
   (c) removing the mask layer to leave a protrusion in the isolating layer;
   (d) depositing an insulating layer on said substrate and said isolating layer; and
   (e) anisotropically etching said insulating layer to form first and second spacers on the sidewalls of the isolating layer.

15. The method as claimed in claim 14, further comprising, before said isolating material depositing step, the steps of depositing a sacrificial layer on said substrate and depositing said mask layer on said sacrificial layer.

16. The method as claimed in claim 15, further comprising, after said mask layer depositing step, the step of patterning said mask layer and said sacrificial layer.

17. The method as claimed in claim 16, further comprising, after said patterning step, the step of etching said mask layer, said sacrificial layer and said substrate to a predetermined depth to form said trench.

18. The method as claimed in claim 14, further comprising the step of implanting low concentration dopant ions into a photodiode region of said substrate, wherein said photodiode region is separated from said isolation layer.

19. The method as claimed in claim 18, further comprising, after implanting said low concentration dopant ions into said photodiode region, implanting high concentration dopant ions into the exposed surface of said substrate.

20. The method as claimed in claim 14, wherein said protrusion extends from a surface of said substrate by an amount of from 640 to 1650 Å.

* * * * *